United States Patent
Hepler et al.

(10) Patent No.: US 7,181,670 B2
(45) Date of Patent: Feb. 20, 2007

(54) PIPELINE ARCHITECTURE FOR MAXIMUM A POSTERIORI (MAP) DECODERS

(75) Inventors: Edward L. Hepler, Malvern, PA (US); Michael F. Starsinic, Philadelphia, PA (US)

(73) Assignee: Interdigital Technology Corporation, Wilmington, DE (US)

( * ) Notice: Subject to any disclaimer, the term of this patent is extended or adjusted under 35 U.S.C. 154(b) by 0 days.

(21) Appl. No.: 11/219,986

(22) Filed: Sep. 6, 2005

(65) Prior Publication Data

US 2006/0005111 A1     Jan. 5, 2006

Related U.S. Application Data

(63) Continuation of application No. 10/037,609, filed on Jan. 2, 2002, now Pat. No. 6,961,921.

(60) Provisional application No. 60/317,855, filed on Sep. 6, 2001.

(51) Int. Cl.
*H03M 13/00* (2006.01)
*H03M 13/03* (2006.01)

(52) U.S. Cl. .................. 714/755; 714/795; 714/796; 375/265; 375/341

(58) Field of Classification Search ............. 714/755, 714/795, 796; 371/341; 375/341
See application file for complete search history.

(56) References Cited

U.S. PATENT DOCUMENTS

| | | | |
|---|---|---|---|
| 5,148,385 A | 9/1992 | Frazier | 708/426 |
| 5,208,816 A | 5/1993 | Seshardi et al. | 714/795 |
| 5,263,026 A | 11/1993 | Parr et al. | 370/350 |
| 5,381,425 A | 1/1995 | Bitzer et al. | 714/793 |
| 5,450,453 A | 9/1995 | Frank | 375/130 |

(Continued)

OTHER PUBLICATIONS

Dielissen et al.: "Power-Efficient Layered Turbo Decoder Processor", Proc. Design, Automation and Test in Europe, 2001, Mar. 2001, pp. 246-251.

(Continued)

*Primary Examiner*—Albert Decady
*Assistant Examiner*—Esaw Abraham
(74) *Attorney, Agent, or Firm*—Volpe and Koenig, P.C.

(57) ABSTRACT

The sliding window approach to pipeline maximum a posteriori (MAP) decoder architecture is modified to decrease processing time. Once the forward metrics have been calculated for the first sliding window of the decoder, the reverse metrics for each window are calculated while the forward metrics for the next window are calculated. As each new forward metric is calculated and stored into memory, the forward metric from the previous window is read from memory for use with reverse metric being calculated in calculating extrinsic value. Each forward metric for use in calculating an extrinsic value is written to the same memory location. The calculations can be reversed, reverse metrics being calculated first, followed by reverse metric calculations. Although this architecture as developed for a turbo decoder, all convolution codes can use the MAP algorithm of the present invention.

28 Claims, 3 Drawing Sheets

U.S. PATENT DOCUMENTS

| | | | |
|---|---|---|---|
| 5,933,462 A | 8/1999 | Viterbi et al. | 375/341 |
| 6,222,406 B1 | 4/2001 | Noda et al. | 327/269 |
| 6,226,773 B1 | 5/2001 | Sadjadpour | 714/799 |
| 6,343,368 B1 | 1/2002 | Lerzer | 714/796 |
| 6,392,572 B1 * | 5/2002 | Shiu et al. | 341/81 |
| 6,452,979 B1 | 9/2002 | Areil et al. | 375/265 |
| 6,477,679 B1 * | 11/2002 | Such et al. | 714/755 |
| 6,563,877 B1 | 5/2003 | Abbaszadeh | 375/242 |
| 6,725,409 B1 | 4/2004 | Wolf | 714/755 |
| 6,754,290 B1 | 6/2004 | Halter | 375/242 |
| 6,757,865 B1 | 6/2004 | Nakamura et al. | 714/796 |
| 6,813,743 B1 * | 11/2004 | Eidson | 714/795 |
| 6,829,313 B1 | 12/2004 | Xu | 375/341 |
| 6,885,711 B2 * | 4/2005 | Shiu et al. | 375/340 |
| 6,950,476 B2 * | 9/2005 | Tarrab et al. | 375/265 |

OTHER PUBLICATIONS

Vogt et al.: "Comparison Of Different Turbo Decoder Realizations For IMT-2000" Proc. Global Telecommunications Conference 1999, vol. 5, Dec. 5, 1999, pp. 2704-2708.

Raghupathy et al.: "A Transformation For Computational Latency Reduction In Turbo-MAP Decoding" Proc. Of The 1999 IEEE International Symposium On Circuits And Systems, May 30, 1999, pp. 402-405.

Halter et al.: "Reconfigurable Signal Processor for Channel Coding And Decoding In Low SNR Wireless Communication" Proc. 1998 IEEE Workshop On Signal Processing System, Oct. 8, 1998, pp. 260-274.

* cited by examiner

PIPELINE ARCHITECTURE FOR MAXIMUM A POSTERIORI (MAP) DECODERS

CROSS REFERENCE TO RELATED APPLICATIONS

The application claims priority from Provisional Patent Application No. 60/317,855, filed Sep. 6, 2001, and is a continuation of U.S. patent application Ser. No. 10/037,609, filed Jan. 2, 2002 now U.S. Pat. No. 6,961,921.

FIELD OF THE INVENTION

The present invention relates to the field of processing error detection and correction algorithms. More specifically, the present invention relates to an efficient pipelined architecture for processing maximum a posteriori (MAP) algorithms.

BACKGROUND OF THE INVENTION

Some error correction algorithms, such as the Turbo Decoder algorithm, use variations of the MAP algorithm to recover a sequence of information bits from an encoded bit sequence that has been corrupted by noise. The recursive nature of the calculation required by the MAP algorithm makes implementation costly.

For example, FIG. 1 illustrates the sequence output by the MAP algorithm as a function of a set of "forward" metrics, and a set of "backward" metrics. However, each forward metric $\alpha(k)$, is a function of the previous forward metric, $\alpha(k-1)$ and each reverse metric $\beta(k-1)$, is a function of the next reverse metric, $\beta(k)$. As illustrated in the timeline diagram of FIG. 1, an architecture that implements this algorithm requires a buffer large enough to hold either all of the forward metrics or all of the reverse metrics such that the other set of metrics can be calculated while the output is calculated, which design leads to a decoder whose latency is proportional to approximately twice the size of the block that needs to be decoded.

In an effort to reduce the buffer required by the MAP algorithm, a modified version of the MAP algorithm, called the sliding window algorithm, has been developed. By making a small approximation in the reverse metric calculations, the sliding window approach reduces the size of the required metric buffer. This is accomplished by dividing the received sequence into windows, and then processing each window.

FIG. 2 illustrates a timeline of how the sliding window calculations are performed when the data has been divided into two windows. The length of the tail and learn size are typically very small compared to the amount of data to be processed. It is clear that as long as the window size is relatively large compared to the size of the learning window, the latency through the decoder is not significantly increased but the size of the buffer required to hold the forward metric is significantly decreased.

Therefore, an objective of the present invention is to reduce both latency and cost associated with implementing such algorithms.

SUMMARY OF THE INVENTION

In the pipelined MAP decoder architecture of the present invention, the sliding window approach is modified so that processing time can be decreased. Once the forward metrics have been calculated for the first window, the reverse metrics for each window are calculated while the forward metrics for the next window are calculated. As each new forward metric is calculated and stored into memory, the forward metric from the previous window is read from memory so that the new reverse metric can be calculated. Each forward metric from the previous window is read from memory on the same clock edge that the new forward metric for the next window is written to the same memory location. By reading and writing the forward metrics to memory in this manner, the size of the forward metric buffer does not need to be increased. The pipelined calculations may also be performed if the data is divided into two windows. Although this architecture was developed for a Turbo Decoder, any decoder that uses a version of the MAP algorithm can use it. The pipelined sliding window architecture decreases processing time. The standard sliding window architecture would need to run at a significantly higher clock rate to achieve the same throughput.

BRIEF DESCRIPTION OF THE DRAWINGS

The present invention will hereinafter be described in conjunction with the appended drawing figures, wherein like numerals designate like elements and, wherein.

DETAILED DESCRIPTION OF THE DRAWINGS

Figure 4:
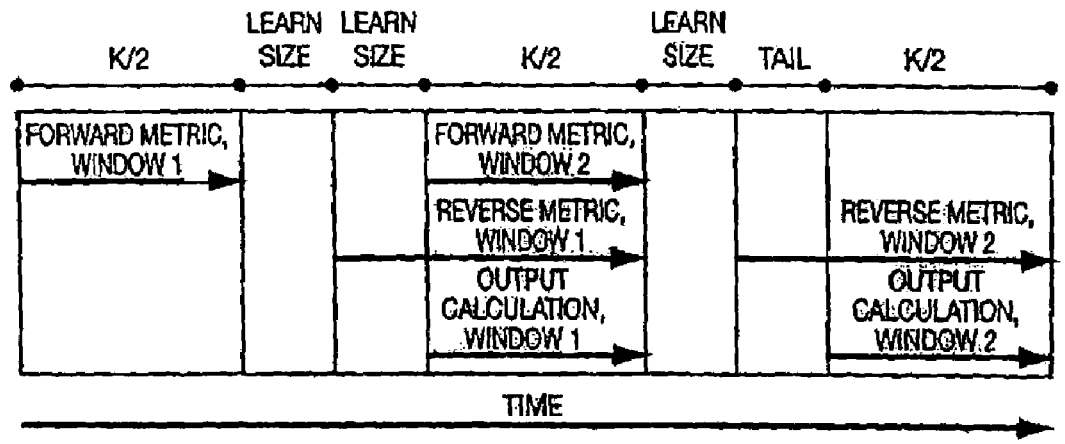
FIG. 4 is a time line of the error correction architecture of the present invention.
Figure 3:
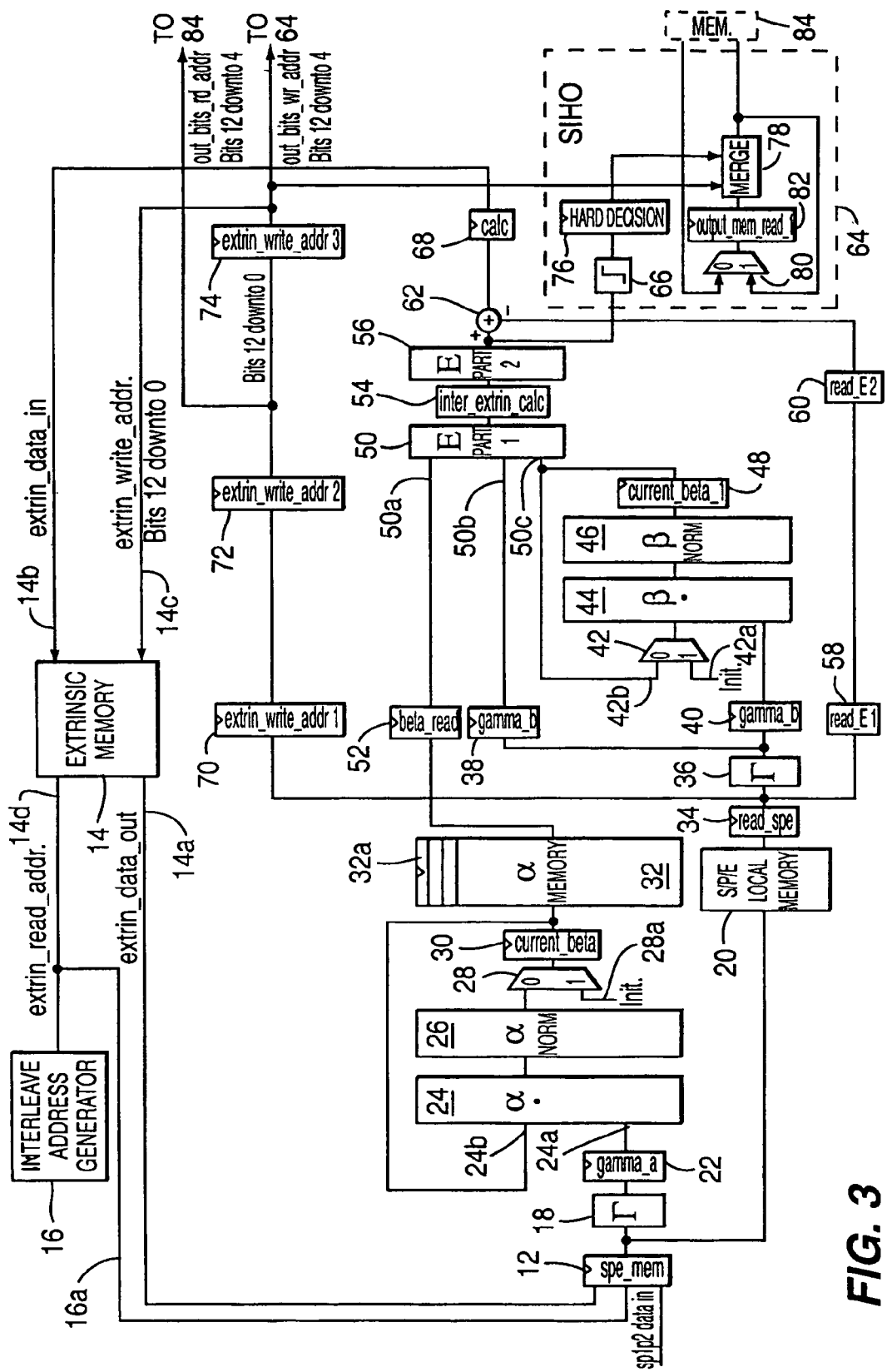
FIG. 3 is a block diagram of a turbo decoder in which the error correction architecture of the present invention may reside.

FIG. 3 of the present invention is a block diagram of a turbo Decoder in which the pipeline decoder architecture of the present invention may reside. In the pipelined MAP decoder architecture of the present invention, the sliding window approach is modified so that processing time can be decreased. FIG. 4 illustrates the timeline accomplished by the present invention. Once the forward metrics have been calculated for the first window, the reverse metrics for each window are calculated while the forward metrics for the next window are calculated. As each new forward metric is calculated and stored into memory, the forward metric from the previous window is read from memory so that the new reverse metric can be calculated. Each forward metric is read from memory on the same clock edge that the new forward metric is written to the same memory location. By reading and writing the forward metrics to memory in this manner, the size of the forward metric buffer does not need to be increased.

FIG. 3 shows a block diagram of one embodiment of a turbo decoder incorporating the principles and or techniques of the present invention.

The turbo decoder 10 receives data from a transmitting facility such as, for example, a base station which converts each data bit ("1" or "0") into three bits, namely a data or systematic bit(s), a first parity bit (p1) and a second parity bit (p2). The sp1p2 data is applied to a register 12 which also receives extrinsic data read out from an extrinsic memory 14, to be more fully described, hereinbelow, and an address obtained from interleave address register 16. Memory register 12 thus initially receives and stores the sp1p2 data, the extrinsic data appearing at line 14a and an address at which the extrinsic data is located, at line 16a. The address accompanies the sp1p2 data throughout the calculations for a purpose to be more fully described hereinbelow.

The sp1p2 data is transferred from register 12 to gamma (γ) calculator 18 and is further stored in local memory 20.

As is conventional in turbo decoders, three quantities, alpha (α), beta (β) and gamma (γ) are defined. For a specific state and a specific time step, a has a value that defines the probability that the coder is at that state at that specific time step. Alpha is derived recursively starting from time k=1 and moving forward in time. The value β is similar to a but works backwards in time. Gamma (γ) is defined as the transition probability that the coder will move from a state at a given time to some allowed state at the next subsequent time increment. Alpha (α) can be calculated for all states in a trellis based on the state transition probabilities represented by gamma (γ). The gamma (γ) calculation performed at stage 18 is stored in register 22. Calculation stages 24 and 26 respectively calculate each alpha and normalize the alpha calculations. Each alpha (α) value is calculated based on the input from register 22 as well as the previously calculated alpha value provided at input 24b and outputted from calculation stage 26 through multiplexer 28 and register 30, which holds eight (8) calculated values. The output of register 30 is coupled to the input of alpha memory 32 which stores the first calculated alpha value at the first memory location 23a and also provides the calculated alpha value to input 24b.

In order to initialize the calculation and, starting at the initial state, the initial eight (8) alpha metrics are set to some initial value, which is applied at the initialized input 28a of multiplexer 28 in order to enable the calculation stages 24 and 26 to calculate the eight (8) values for alpha. As was mentioned hereinabove, the sp1p2 data is stored in local memory 20.

Initially, all of the alpha values are calculated, whereupon the beta values are calculated by utilization of the sp1p2 data which are read in reverse order from local memory 20 (i.e., "last-in, first-out order") in order to perform the calculations required for the backwards recursive formula for beta. As the sp1p2 data last read in local memory 20 is read into register 34, which contains not only the sp1p2 data, but the extrinsic value (which in the initial stage operation is 0), as well as the data representing the memory location in which the initial extrinsic value located in the extrinsic memory 14. The sp1p2 and extrinsic data undergo calculation at gamma (γ) calculation stage 36. The output of the gamma (γ) calculation stage 36 is applied to gamma registers 38 and 40. The beta (β) calculations are respectively performed by beta calculation stage 44 and beta normalization stage 46. Initially, a start condition of binary one ("1") is applied to input 42a of multiplexer 42. The normalized beta calculation is initially applied to extrinsic value calculation stage 50 through output register 48 which further applies the last calculated input to input 42b of multiplexer 42. Extrinsic value calculator stage 50 calculates an extrinsic value for each time state k by looking at the alpha (α) value from register 52 received at input 50a, the gamma (γ) value from register 38 received at input 50b and the beta (β) output from register 48 received at input 50c. Registers 48, 52 and 38 are provided to assure time registration of the signals at the extrinsic value calculator stage 50.

The intermediate value calculated by first value extrinsic calculator stage 50 is applied to register 54 which transfers its contents to the second stage 56 of the extrinsic value calculator.

As was mentioned hereinabove, register 34 transfers its contents to register 58 which in turn transfers its contents to register 60, the contents of register 60 being subtracted from the extrinsic value appearing at the output of the second extrinsic value calculation stage 56, this subtraction stage being performed at the subtraction circuit 62.

The extrinsic value obtained at stage 56 is further applied to a soft-in-hard-out (SIHO) circuitry 64 comprised of a binary state determining circuit 66 receiving the output of second extrinsic calculation stage 56. The operation of circuit 66 in SIHO circuit 64 will be set forth in greater detail hereinbelow.

The difference output at difference circuit 62 is applied to register 68 which applies the extrinsic value calculation to extrinsic memory 14 at 14b. As was mentioned hereinabove, local memory 20, in addition to storing the data, parity and extrinsic values, further stores the first extrinsic value address of extrinsic memory 14, this address being successively coupled through memory register 34 and time synchronizing registers 70, 72 and 74 to provide the location in extrinsic memory 14 where the extrinsic value calculation is to be stored, the memory location data being applied to extrinsic memory 14 at 14c.

Figure 2:
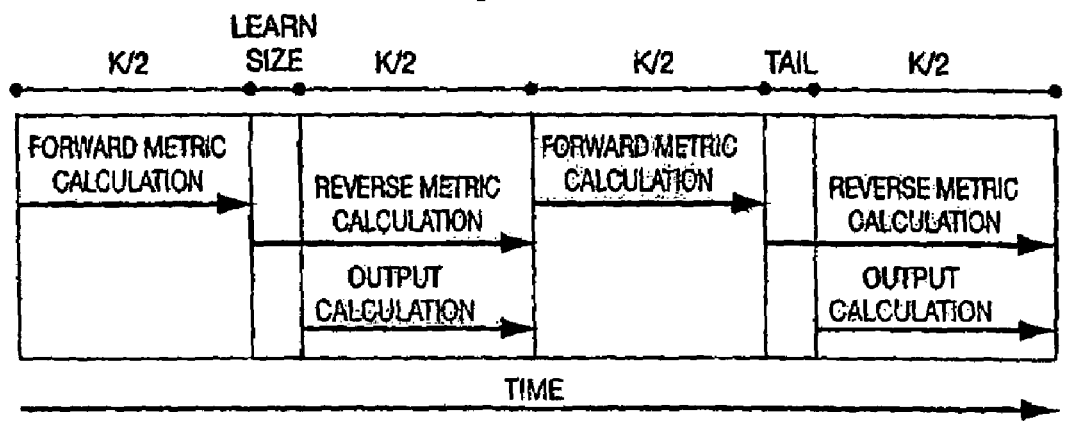
FIG. 2 is a second example of a time line of a prior art error correction algorithm architecture in which the forward and reverse metrics are calculated using sliding windows.

As was set forth hereinabove with reference to the example shown in FIG. 2, half of the calculations for determining alpha are performed during the first time window k/2.

Calculation of the reverse metrics (β) are performed during the last half (k/2) of the first window. Alpha values are read out from alpha memory 32 in the reverse order from which they are stored. The alpha values calculated during the forward metric for window 2 (see FIG. 4), are simultaneously stored into the memory location from which the alpha values calculated during window 1 are read out for purposes of calculating the extrinsic value, thereby reducing the memory capacity by one half, in the embodiment of FIG. 3. It should be noted that the newly calculated alpha values are stored in reverse order from those calculated during the first window.

In each subsequent pair of window calculations, the number of calculations performed being a function of the number of desired iterations for calculating the extrinsic value, the order of read out and write in of alpha values in alpha memory 32 is reversed so that, as previously calculated alpha values are read out stored in the order of last memory location to first, the alpha values are read out in the reverse order from first memory location to last and the alpha values determined in the window 2 of the second iteration for the forward metric, new values calculated at 24/26 are read in to those locations from which alpha values are being read out.

As was described hereinabove, when an extrinsic value has been calculated, i.e., upon the completion of the first iteration, this extrinsic value is read out of extrinsic memory 14 and is used during the calculations of the next iteration. Conventional control circuitry, not shown for purposes of simplicity, determines the number of iterations to be performed.

As was described hereinabove, as each extrinsic value is determined, it is applied to circuitry 66 which determines whether the data bit is a "1" or "0" by examining its amplitude, and when above a certain threshold is determined to be a "1" and when below a certain threshold is determined to be a "0". This established value is applied to register 76 and is merged together with the extrinsic value memory location, derived from register 74 and applied to merge circuit 78. The output bit is written into a memory 84. The SIHO circuitry 64 writes each bit into a memory location in which each row is 16 bits wide. The merge circuit multiplexer 78, multiplexer circuit 80 and output memory read register 82 operate so as to utilize all 16 binary bits of each memory location by storing 16 data bits evaluated by the binary state determining circuit 66.

Figure 1:
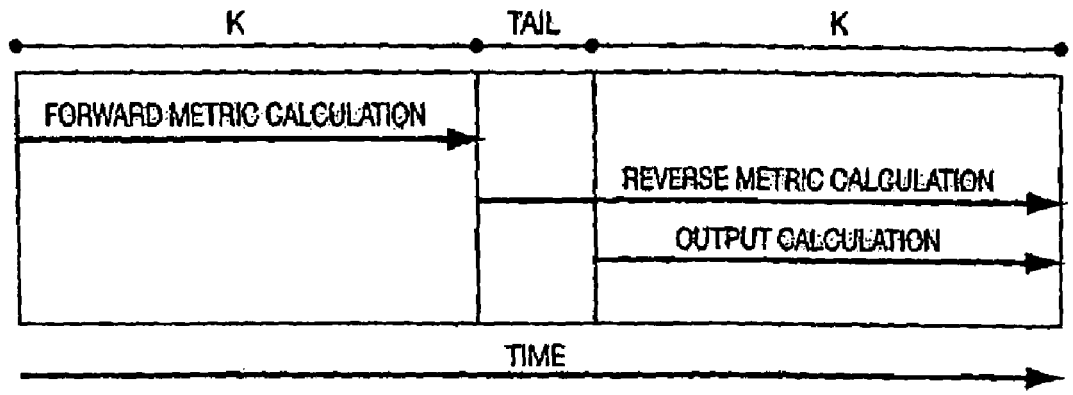
FIG. 1 is one example of a time line of a prior art error correction algorithm architecture.
Figure 3A:
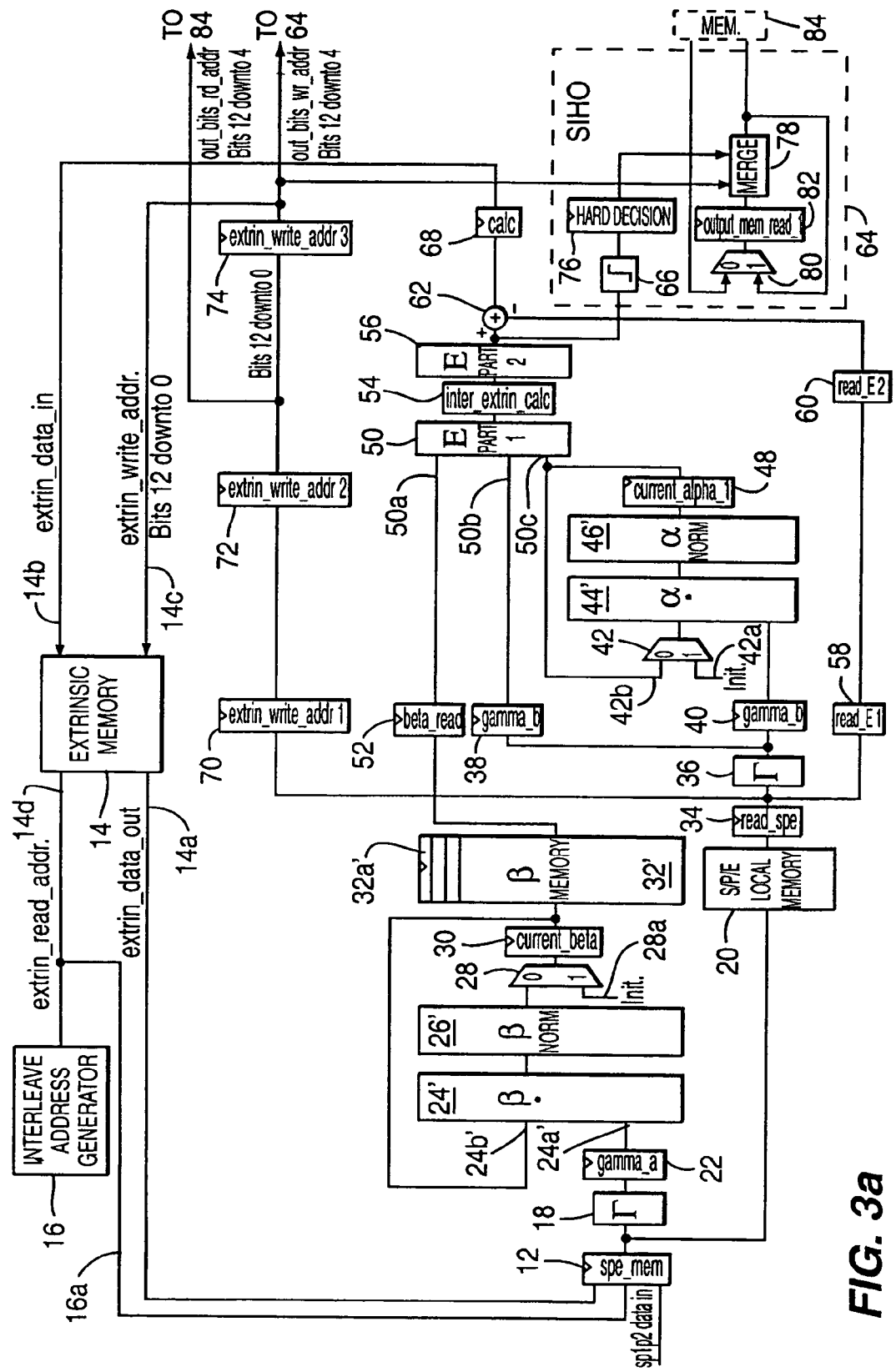
FIG. 3a is a block diagram of an alternative turbo decoder wherein the calculations of the forward and reverse metrics are reversed.

Although the embodiment shown in FIG. 3 teaches an implementation in which alpha is calculated during the first window and beta is calculated during the latter portion of the first window, it should be understood that the alpha and beta calculations may be reversed, as shown in FIG. 3a, while still deriving all the benefits of the embodiment shown in FIG. 1, namely the significantly reduction in calculation time as well as a 50% reduction in the memory requirements for the turbo decoder of FIG. 3 as compared with present day techniques and apparatus. The architecture of the present invention enables further reductions in memory size. For example, the data may be processed using three (3) windows, four (4) windows, etc, which provide further reductions in memory size. For example, using four (4) windows results in a memory size that is ⅓ the memory size compared to processing where no windowing is employed.

FIG. 4 also illustrates how the pipeline calculations would be performed if the data were divided into two windows. Neglecting the size of the learning windows and number of tail bits, the latency through the pipeline sliding window decoder in this example is proportional to 1½ K as opposed to 2 K in the simple sliding window architecture. Latency can be reduced by changing the window size, number of windows, and learning size according to the amount of data that needs to be processed.

Although the above-described architecture was developed for a turbo decoder, all convolution codes can use a MAP decoder. The calculation of the forward metrics may be calculated before or after the reverse metrics. The reverse metrics could be calculated first, and then the forward metrics can be calculated while the output calculations are performed. This can be accomplished as shown, for example, by the embodiment of FIG. 3a wherein calculation block 24[1] is a beta calculator; calculation block 24 is a beta normalization calculation block, memory 32[1] is a beta memory; calculation block 44[1] is an alpha calculation block and calculation block 46[1] is an alpha normalization calculation block.

The operation of the embodiment of FIG. 3a is otherwise substantially the same as the embodiment of FIG. 3.

What is claimed is:

1. A method for operating a memory in a turbo decoder, comprising
   calculating forward metrics of received data during a first window;
   storing forward metrics calculated during said first window in said memory in an order in which the forward metrics are calculated;
      calculating forward metrics of received data during a second window; and
      storing the forward metrics calculated during said second window in said memory wherein each forward metric stored in said memory and calculated during said second window is read into a same memory location in said memory which is occupied by a forward metric calculated during said first window and which is being read out of the memory for use in a reverse metrics calculation.

2. The method of claim 1 wherein said data is comprised of a data bit accompanied by at least one parity bit;
   said method further comprising:
   assigning an address to each data and which accompanies said data during the calculations.

3. The method of claim 2 wherein said data is comprised of said data bit and at least two parity bits which accompany said data during said calculations.

4. The method of claim 1 wherein said storing step further comprises: storing a forward metric calculated during said second window in a memory location in the memory on a given clock edge and reading out the forward metric calculated during said first window and occupying said memory location on said given clock edge.

5. The method of claim 1 further comprising:
   assigning extrinsic data to each received data.

6. The method of claim 5 further comprising:
   employing the extrinsic data in the performance of the forward metrics calculations.

7. The method of claim 1 further comprising reading out of the memory forward metrics stored during said first window in a reverse order from which they were stored.

8. Apparatus for operating a memory in a turbo decoder, comprising:
   means for calculating forward metrics of received data during a first window;
   means for storing forward metrics calculated during said first window in said memory in an order in which the forward metrics are calculated;
   means for calculating forward metrics in a second window;
   means for storing the forward metrics calculated during said second window in said memory wherein each forward metric stored in said memory and calculated during said second window is read into a same memory location in said memory which is occupied by a forward metric calculated during said first window and which is being read out of said memory location for use in a reverse metrics calculation.

9. The apparatus of claim 8 wherein said data is comprised of a data bit accompanied by at least one parity bit and further comprising:
   means for assigning an address to each data and which accompanies said data during the calculations.

10. The apparatus of claim 9 wherein said data is comprised of said data bit and at least two parity bits which accompany said data during said calculations.

11. The apparatus of claim 8 wherein said means for storing further comprises:
   means for storing a forward metric calculated during said second window in a memory location in the memory on a given clock edge and reading out the forward metric, calculated during said first window and occupying said memory location, on said given clock edge.

12. The apparatus of claim 8 further comprising:
   assigning extrinsic data to each received data.

13. The apparatus of claim 12 further comprising:
   said means for calculating including means for employing the extrinsic data in the performance of the forward metrics calculations.

14. The apparatus of claim 8 further comprising:
said means for reading out the memory reads forward metrics stored during said first window in a reverse order from which they were stored.

15. A method for operating a memory in a turbo decoder, comprising:
calculating reverse metrics of received data during a first window;
storing reverse metrics calculated during said first window in said memory in an order in which the reverse metrics are calculated;
calculating reverse metrics of received data during a second window; and
storing the reverse metrics calculated during said second window in said memory wherein each reverse metric stored in said memory and calculated during said second window is read into a same memory location in said memory which is occupied by a reverse metric calculated during said first window and which is being read out of the memory for use in a forward metrics calculation.

16. The method of claim 15 wherein said data is comprised of a data bit accompanied by at least one parity bit;
said method further comprising:
assigning an address to each data and which accompanies said data during the calculations.

17. The method of claim 16 wherein said data is comprised of said data bit and at least two parity which accompany said data during said calculations.

18. The method of claim 15 wherein said storing step further comprises:
storing a reverse metric calculated during said second window in a memory location of the memory on a given clock edge and reading out the reverse metric occupying said memory location on said given clock edge.

19. The method of claim 15 further comprising:
assigning extrinsic data to each received data.

20. The method of claim 19 further comprising:
employing the extrinsic data in the performance of the reverse metrics calculations.

21. The method of claim 15 further comprising reading out the memory reverse metrics stored during said first window in a reverse order from which they were stored.

22. Apparatus for operating a memory in a turbo decoder, comprising:
means for calculating reverse metrics of received data during a first window;
means for storing reverse metrics calculated during said first window in said memory in an order in which the reverse metrics are calculated;
means for calculating reverse metrics in a second window;
means for storing the reverse metrics calculated during said second window in said memory wherein each reverse metric stored in said memory and calculated during said second window is read into a same memory location in said memory occupied by a reverse metric calculated during said first window and which is being read out of said memory location for use in a forward metrics calculation.

23. The apparatus of claim 22 wherein said data is comprised of a data bit accompanied by at least one parity bit and further comprising:
means for assigning an address to each data and which accompanies said data during the calculation.

24. The apparatus of claim 23 wherein said data is comprised of said data bit and at least two parity bits which accompany said data during metric calculations.

25. The apparatus of claim 22 wherein said means for storing further comprises:
means for storing a reverse metric calculated during said second window in a memory location in the memory on a given clock edge and reading out the reverse metric, calculated during said first window and occupying said memory location, on said given clock edge.

26. The apparatus of claim 22 further comprising:
assigning extrinsic data to each received data.

27. The apparatus of claim 26 further comprising:
said means for calculating including means for employing the extrinsic data in the performance of the reverse metrics calculations.

28. The apparatus of claim 25 further comprising:
said means for reading out of the memory reads reverse metrics stored during said first window in a reverse order from which they were stored.

* * * * *

UNITED STATES PATENT AND TRADEMARK OFFICE
CERTIFICATE OF CORRECTION

PATENT NO. : 7,181,670 B2
APPLICATION NO. : 11/219986
DATED : February 20, 2007
INVENTOR(S) : Hepler et al.

It is certified that error appears in the above-identified patent and that said Letters Patent is hereby corrected as shown below:

At column 3, line 13, after the word "step" delete "a" and insert therefor --α--.

At column 3, line 16, before the word "but", delete "a" and insert therefor --α--.

At column 3, line 50, after "memory 14", delete ". The" and insert therefor --, the--.

At column 5, line 17, after the words "namely the", delete "significantly" and insert therefor --significant--.

At column 5, line 25, after the words "that is", delete "3" and insert therefor --1/4--.

At claim 17, column 7, line 28, after the words "two parity", insert --bits--.

Signed and Sealed this

Twentieth Day of November, 2007

JON W. DUDAS
*Director of the United States Patent and Trademark Office*